US005462917A

United States Patent [19]

Salama et al.

[11] Patent Number: 5,462,917
[45] Date of Patent: * Oct. 31, 1995

[54] PROCESS OF PREPARING SUPERCONDUCTIVE OXIDE COMPLEXES CONTAINING L, BA, CU AND O AND METHOD OF USING THE SAME

[75] Inventors: Kamel Salama; Venkatakrishnan Selvamanickam, both of Houston, Tex.

[73] Assignee: University of Houston-University Park, Houston, Tex.

[*] Notice: The portion of the term of this patent subsequent to Sep. 11, 2007, has been disclaimed.

[21] Appl. No.: 194,941

[22] Filed: Feb. 14, 1994

Related U.S. Application Data

[62] Division of Ser. No. 753,012, Aug. 23, 1991, Pat. No. 5,306,697, which is a continuation of Ser. No. 477,311, Feb. 8, 1990, abandoned, which is a continuation-in-part of Ser. No. 309,382, Feb. 10, 1989, Pat. No. 4,956,336.

[51] Int. Cl.$^6$ ........................... H01L 39/12; H01B 12/16; C04B 35/653; C01F 11/02

[52] U.S. Cl. .................. 505/150; 505/126; 505/778; 505/780; 505/785; 505/490; 505/491; 505/450; 505/500; 505/742; 505/779; 252/518; 252/521; 264/66; 419/25; 419/29; 419/53; 423/604; 423/635

[58] Field of Search ........................... 505/126, 778, 505/780, 785, 779, 150, 490, 491, 450, 500, 742; 252/518, 521; 264/66; 419/25, 29, 53; 423/604, 635; 502/346, 302, 303, 304; 501/123

[56] References Cited

U.S. PATENT DOCUMENTS

| | | | |
|---|---|---|---|
| 4,824,826 | 4/1989 | Damento et al. | 252/521 |
| 4,826,808 | 5/1989 | Yurek et al. | 505/1 |
| 4,892,861 | 1/1990 | Ray | 505/1 |
| 4,943,557 | 6/1990 | Ling | 505/1 |
| 4,952,554 | 8/1990 | Jin et al. | 505/1 |
| 4,973,575 | 11/1990 | Capone | 505/1 |
| 4,975,411 | 12/1990 | Danby et al. | 505/1 |
| 4,990,493 | 2/1991 | Lay | 505/1 |
| 5,011,823 | 4/1991 | Jin et al. | 505/1 |
| 5,077,272 | 12/1991 | Chen et al. | 505/1 |
| 5,093,314 | 5/1992 | Takahashi et al. | 505/1 |
| 5,106,829 | 4/1992 | Quadri et al. | 505/1 |

OTHER PUBLICATIONS

Lipson, A. G., et al., "Effect of the mechanoactivation of components on the physiochemical properties", *Dokl. Akad. Nauk SSSR* (1989 Month not known), 306(6), 1409–12 (Abstract only).

He, L. et al., "Effect of compensation amounts of oxygen and oxygen deficiencey on superconductivity", *Jilin Daxue Ziran Kexue Xuebao* (1989 Month not known), (1), 60–4 (Abstract only).

Arendt et al., "Aligned Sintered Compacts of $RBa_2Cu_3O_{7-x}$", *Materials Research Society Symposium Proceedings*, vol. 99, pp. 203–208, Dec. 1988.

Chaurdhari et al., "Critical Current Measurement in Epitaxial Films of $YBa_2Cu_3O_{7-x}$ Compound", *Physical Review Letters*, 58 (25), pp. 2684–2686, 1987, month not known.

Chen et al., "Texture Development in $YBa_2Cu_3O_x$ by Hot Extrusion and Hot Pressing", *Journal for American Ceramic Society*, vol. 70[12] C–388–C–390, 1987, month not known.

Ekin et al., "Transport Critical Current in Bulk Sintered $Y_1Ba_2Cu_3O_x$ and Possibilities For Its Enhancement", *Advanced Ceramic Materials*, vol. 2 (3B), pp. 586–592, Jul. 1987.

Ferreira et al., "Magnetic Field Alignment of High–$T_c$ Superconductors $RBa_2Cu_3O_{7-\delta}$ (R=Rare Earth)", *Applied Physics*, A, vol. 47, pp. 105–110, 1988, month not known.

Garland et al., "A Novel Metal Matrix–High $T_c$ Superconducting Composite", *Materials Research Society: Extended Abstracts*, pp. 319–321, Apr. 1988.

Grader et al., "Improved Press Forging of $Ba_2YCu_3O_x$ Superconductor", *Applied Physics Letters*, 52 (21), pp. 1831–1833, May 23, 1988.

Goyal et al., "Cermets of the $Y_1Ba_2Cu_3O_{7-\delta}$ Superconductors", *Materials Letters*, vol. 6 (8, 9), pp. 257–260, May 1988.

Hidaka et al., "Anistrophy of the Upper Critical Magnetic Field in Single Crystal $YBa_2Cu_3O_{7-y}$", *Japanese Journal of Applied Physics*, vol. 26(5), pp. L726–L728, May 1987.

Jiang et al., "Crystal Growth of Y–Ba–Cu–O Compound by Laser Floating Zone Melting", *Materials Research Society: Extended Abstracts*, pp. 125–128, Apr. 1988.

(List continued on next page.)

Primary Examiner—Paul Lieberman
Assistant Examiner—Douglas J. McGinty
Attorney, Agent, or Firm—Pravel, Hewitt, Kimball & Krieger

[57] ABSTRACT

A superconductor material having a current density, J, of from about 30,000 to about 85,000 amps/cm$^2$ at zero magnetic field and 77° K is disclosed. The 123 superconductor, of the formula $L_1Ba_2Cu_3O_6+\delta$ wherein L is preferably yttrium, is capable of entrapping sufficiently high magnetic fields and exhibits a low microwave surface resistance. The process of preparing the superconductor comprises compacting the bulk product, $L_1Ba_2Cu_3O$, and then sintering the reaction product at a temperature between about 40° C. to about 90° C. below its melting point, i.e., for $Y_1Ba_2Cu_3O_6+\delta$ at a temperature of approximately 940° C. The composition is then heated in a preheated chamber maintained at approximately 1090° C. to about 1,200° C. (approximately 1,100° C. for $Y_1Ba_2Cu_3O_6+\delta$) until it has been decomposed, and is then rapidly cooled to a temperature between about 10° C. to about 30° C. above its melting point, i.e. for $Y_1Ba_2Cu_3O_6+\delta$ a temperature of 1030° C., and then is controlled cooled at a rate of 1° C./hr until it reaches a temperature of about 20° C. to about 40° C. below its melting point, i.e., for $Y_1Ba_2Cu_3O_6+\delta$ a temperature of 980° C. The composition is steadily held at this temperature for at least eight hours, and then cooled to a temperature of approximately 400° C. below its melting point (for $Y_1Ba_2Cu_3O_6+\delta$ approximately a temperature of 600° C.). The material is then slowly cooled by another 200° C. and is then annealed in oxygen.

20 Claims, 5 Drawing Sheets

OTHER PUBLICATIONS

Jin et al., "Melt–Textured Growth of Polycrystalline $YBa_2Cu_3O_{7-\delta}$ with High Temperature $J_c$ at 77K", *Physical Review B*, vol. 37, No. 13, pp. 7850–7854, 1988, month not known.

Jin et al., "High Critical Currents in Y–Ba–Cu–O Superconductors," *Applied Pysics Letters*, vol. 52, No. 24, p. 2074, 1988, month not known.

Jin et al., "Large Magnetic Hysteresis in a Melt–Textured Y–Ba–Cu–O Superconductor," *Applied Physics Letters*, vol. 54, No. 6, pp. 584–586 Feb. 6, 1989.

Katayama–Yoshida, "Growth of $YBa_2Cu_3O_{7-\delta}$ Single Crystals," *Japanese Journal of Applied Physics*, 26(12), pp. L2007–L2009, Dec. 1987.

Kennedy et al., "Frequency–Dependence of the Microwave Surface Resistance of Ceramic $Y_1Ba_2Cu_3O_y$," *Solid State Communications*, 70:7, pp. 741–744, 1989 month not known.

Kumakura et al., "Large Magnetization in $YB_2Cu_3O_7$ Prepared by Sintering at High–Temperatures," *Japanese Journal of Applied Physics*, vol. 27(2), L188–L190, Feb. 1988.

Lee et al., "Epitaxial Growth of $YBa_2Cu_3O_{7-\delta}$ Thin Films on $LiNbO_3$ Substrates", *Applied Physics Letters*, vol. 55(12), pp. 1261–1263, Sep. 18, 1989.

Marshall et al., "Ordered –Defect Structure in Epitaxial $YBa_2Cu_3O_{7-x}$ Thin Film," *Physical Review B*, vol. 37, (16), pp. 9353–9358, Jun. 1988.

Matsushita et al., "Critical Current Densities in Superconducting Y–Ba–Cu–O Prepared by the Quench–and–Melt Growth Technique", *Japanese Journal of Applied Physics*, vol. 28 (9), pp. L–1545–L–1548, Sep. 1989.

McGinn et al., "Texture Processing of $YBa_2Cu_3O_{7-x}$ By Joule Heat Zone Melting", *Physica C* 156, pp. 57–61, 1988, month not known.

Murakami et al., "Critical Current and Stability of Epitaxially Grown $Ba_2YCu_3O_{7-y}$ Thin Films", *Kyoto Conference: Abstracts*, p. 2037, 1987, month not known.

Murphy et al., "Processing Techniques for the 93K Superconductor $Ba_2YCu_3O_y$," *Science*, vol. 241, pp. 922–930, 1988 month not known.

Narayan et al., "Microstructure and Properties of $YBa_2Cu_3O_{9-\delta}$ Superconductors with Transitions at 90 and near 290K," *Applied Physics Letters* 51 (12), pp. 940–942, Sep. 1987.

Numata et al., "Fabrication of Multifilamentary Y–Ba–Cu–O Superconductors," *Applied Physics Letters*, 52(26), pp. 2261–2262, 1988, month not known.

People's Daily, Abstract, Japan, Dec. 30, 1988.

Peterson et al., "Magnetic Inducement of Texture in $Ba_2YCu_3O_{6.9}$ Particle Assemblies Under Cryogenic Conditions ," *Journal for American Ceramic Society*, 71(11), pp. 458–459, 1988, month not known.

Robinson et al., "IBM Superconductor Leaps Current Hurdle", *Research News*, pp. 1189, Jun. 5, 1987.

Salama et al., "High Current Density in Bulk $YBa_2Cu_3O_x$ Superconductor," *Applied Physics Letters*, 54(23), pp. 2352–2354, 1989 month not known.

Satchell et al., "High–Magnetic–Field Critical Currents in Thin Films of $YBa_2Cu_3O_7$," *Nature*, vol. 334, pp. 331–333, Jul. 1988.

Schneemeyer et al., "Superconductivity in $YBa_2Cu_3O_7$ Single Crystals", *Nature*, vol. 328, pp. 601–603, Aug. 1987.

Sekine et al., "Fabrication of Multifilamentary Y–Ba–Cu–O Oxide Superconductors", *Applied Physics Letters*, vol. 52(26), pp. 2261–2262, Jun. 27, 1988.

Tajima et al., "Composition Dependence of the Physical Properties in the Superconducting Y–Ba–Cu–O System," *Japanese Journal Applied Physics*, vol. 26, No. 5, L 845–847, May 1987.

Takada et al., "Formation of Barium Copper Yttrium Oxide $(YB+a_2Cu_3O_x)$ by Peritectic Reaction", Chemical Abstracts, 101, No. 8, p. 295, Aug. 1988.

Taylor, "Sintering Time and Temperature for $Ba_2YCu_3O_{7-x}$ Superconductors", *Material Research Society Symposium Proceedings*, vol. 99, pp. 663–666, 1987 month not known.

Weinstein et al., "Persistant Magnetic Fields Trapped in High $T_c$ Superconductor," *Applied Physics Letters*, 56 (15), 1475, 1477, 1990 month not known.

Wolsky et al., "The New Superconductors: Prospects for Application, " *Scientific American*, p. 61–69, Feb. 1989.

Yurek et al., "Direct Synthesis of a Metal/ Superconducting Oxide Composite by Oxidation of a Metallic Precursor," *Journal ElectroChemical Society*, vol. 134(10), pp. 2635–2636, 1987 month not known.

Dimos et al., "Orientation Dependence of Grain–Boundary Critical Currents in $YBa_2Cu_3O_{7-\delta}$ Bicrystals", *Physical Review Letters*, vol. 61(2), pp. 219–222, Jul. 11, 1988.

Ekin, "Evidence for Weak Link and Anisotrophy Limitations on the Transport Critical Current in Bulk Polycrystalline $Y_1Ba_2Cu_3O_x$", *Journal of Applied Physics*, vol. 62(12), pp. 4821–4828, Dec. 15, 1987.

Jin et al., "Fabrication of Dense $Ba_2YCu_3O_{7-\delta}$ Superconductor Wire by Molten Oxide Processing", *Applied Physics Letters*, vol. 51(12), pp. 943–945, Sep. 21, 1987.

Kumakura et al., "Localized Large Superconducting Critical Currents in $BA_2Y_1Cu_3O_{9-y}$," *Applied Physics Letters*, vol. 51, No. 19, pp. 1557–1559, Nov. 9, 1987.

Mannhart et al., "Critical Currents in [001] Gains and Across Their Tilt Boundaries in $YBa_2Cu_3O_7$ Films", *Physical Review Letters*, vol. 61, No. 21, pp. 2476–2479, Nov. 21, 1988.

Mimura et al., "Improvement of the Critical Current Density in the Silver Sheathed Bi–Pb–Sr–Cu–Ca–O Superconducting Tape", *Applied Physics Letters*, vol. 54(16), pp. 1582–1584, Apr. 17, 1989.

Roas et al., "Anisotrophy of the Critical Current Density in Epitaxial $YBa_2Cu_3O_x$ Films", *Physical Review Letters*, vol. 64, No. 4, pp. 479–482, Jan. 22, 1990.

Uemura et al. "μSR Studies of High $T_c$ Superconductivity", *Journal de Physique*, vol. 49, pp. C8–2087–92, Dec. 1988.

PROCESS OF PREPARING SUPERCONDUCTIVE OXIDE COMPLEXES CONTAINING L, BA, CU AND O AND METHOD OF USING THE SAME

This is a division of Ser. No. 753,012, filed Aug. 23, 1991, now U.S. Pat. No. 5,306,697 issued Apr. 26, 1994 which is a continuation of application Ser. No. 07/477,311 (now abandoned) filed on Feb. 8, 1990 which is a continuation-in-part of application Ser. No. 07/309,382 (now U.S. Pat. No. 4,956,336), filed Feb. 10, 1989.

BACKGROUND OF THE INVENTION

The most distinctive property of a superconductive material is the near total loss of electrical resistance by the material when at or below a critical temperature. This critical temperature is characteristic of the material and is referred to as the superconducting transition temperature of the material, $T_c$.

The history of research into the superconductivity of specific materials began with the discovery in 1911 that mercury superconducts at a transition temperature of about 4° K. In the 1920's NbC was found to superconduct at a higher temperature, namely up to about 10.5° K. Since that time, many applications for the phenomena of superconductivity have been conceived which could not be commercialized because of the extreme low transition temperatures of the superconductive material.

Although many materials have been examined in an effort to find compounds which will superconduct at higher, more practical temperatures, the highest temperature superconductor known until about 1986 was $Nb_3Ge$ having a critical temperature, Tc, of approximately 23.3° K. Superconducting devices utilizing $Nb_3Ge$ as the superconductor, like those devices which employed the superconductors preceding $Nb_3Ge$, required the use of liquid helium as refrigerant-coolant in commercial applications. In 1986 Bednorz and Muller disclosed that certain mixed phase compositions of La-Ba-Cu-O appeared to exhibit superconductivity at about 30° K. Investigation of that system established that the crystalline phase therein responsible for superconductivity had a crystal structure like that of $K_2NiF_4$ (214). The upper temperature limit of onset, $T_{co}$, for superconductors of a 214 type crystalline structure has been found to be about 48° K.

Following the discovery of superconductivity in such rare earth-alkaline earth Cu oxide systems of a 214 crystalline structure, a new class of rare earth-alkaline earth-copper oxides was discovered which were superconductive at temperatures above 77° K. This new class of rare earth-alkaline earth-copper oxides, commonly referred to as "123" high-temperature superconductors, have perovskite related crystalline structures. The unit cell consists of three sub-cells stacked one above the other along the C-axis. X-ray crystallographic and neutron powder diffraction studies indicate the structure to be oxygen deficient and that the ordering of oxygen in the basal planes is critical to the oxide exhibiting superconductivity properties. See C. Poole et al, *Copper Oxide Superconductors* (John Wiley & Sons 1988). The unit cell formula of the 1,2,3 compound is
$L_1M_2Cu_3O_6+\delta$ ($\delta$=0.1 to 1.0, preferably about 1.0)
wherein L is scandium, yttrium, lanthanum, cerium, praseodymium, neodymium, samarium, europium, gadolinium, terbium, dysprosium, holmium, erbium, thulium, ytterbium, and lutetium, and M is barium, strontium or mixtures thereof. The studies indicate that when $\delta$ is between about 0.1 to about 0.5, the resulting 1,2,3 compound exhibits a tetragonal unit cell crystallographic symmetry and is non-superconductive. In this unit cell, the lattice dimensions of the C-axis is approximately 11.94 angstroms and the a and b axes are approximately 3.9 angstroms. When $\delta$ is between 0.5 and 1.0, the resulting 1,2,3 compound has an orthorhombic unit cell crystallographic symmetry and is superconductive. The orientation of the oxygen atoms in the unit cell causes the cell to compress slightly along the a axis and thus the lattice dimension of the a axis is less than that of the b axis. Lattice constants a=3.80, b=3.86 and c=11.55 have been reported for the orthorhombic unit cell.

With the discovery of the 123 class of high temperature superconductivity compositions it has become possible to economically pursue many previously conceived applications of the superconductivity phenomena which were commercially impractical wherein cooling by liquid helium was required. Since they superconduct at temperatures greater than 77° K, the new "123" class of high temperature superconductors may in practical applications be cooled with liquid nitrogen—a more economically feasible refrigerant. As a result, the rather complex thermal insulation and helium-recycling systems employed with conventional superconductors, in order to avoid wasting the expensive helium coolant, has been abandoned, thereby greatly simplifying and enhancing the reliability of commercial superconductors.

However, the heretofore high temperature superconductors have been impractical in some applications due to their inability to (1) carry high current loads in intense magnetic fields, (2) entrap strong magnetic fields, and (3) exhibit low high-frequency surface resistance. As a result, significant commercial barriers against use of the 123 superconductors in numerous applications, such as in magnets, magnetic separators, transmission lines, high frequency generators and magnetically levitating trains (meglav) exist.

In magnetic separators, for example, superconductors are required to have a current density, J, between about 33,000 and 66,000 amps/cm$^2$ in a magnetic field between 2 and 3 T. In order to be commercially practical in transmission lines and high frequency generators, the superconductive material must further exhibit a very small high frequency surface resistance at or below its critical temperature. To be practical in magnets, superconductive materials must, in addition to being lightweight, be capable of entrapping within their crystalline structure a high magnetic field. [While superconductive materials of low $T_c$ are reported as being capable of entrapping fields as high as 22,400 Gauss (see, for example, M. Rabinowitz, E. L. Garwin and D. J. Frankel, *Lettere Al Nuovo Cimento*, 7, 1, (1973); E. L. Garwin, M. Rabinowitz, and D. J. Frankel, *Appl. Phys. Lett.*, 22, 599 (1973); M. Rabinowitz, H. W. Arrowsmith and S. D. Dahlgren, *Appl. Phys. Lett.*, 30, 607 (1977); and M. Rabinowitz, *IEEE Magnetics*, 11, 548 (1975)), such superconductors are not commercially viable for use in magnets due to their low $T_c$ as well as their inability to carry high current loads.]

SUMMARY OF THE INVENTION

The invention comprises a 123 high temperature superconductor material having a current density, J, of from about 30,000 to about 85,000 amps/cm$^2$ at zero magnetic field and 77° K. Such superconductive materials are characterized by a $T_c$ of at least 77° K and are capable of entrapping a magnetic field, $B_t$, when placed in an external magnetic field of 8000 Gauss, of at least 800 Gauss. At 60° K, the superconductive material of this invention is further defined by a surface resistance in the a-b crystallographic plane at 98 GHz of less than about 6 milliohms. The preferred 123 superconductor is $L_1Ba_2Cu_3O_6+\delta$ wherein L is yttrium. Such superconductors are produced by a liquid phase process which comprises compacting the bulk product, $L_1Ba_2Cu_3O$, and then sintering the product at a temperature between about 40° C. to about 90° C. below its melting point, i.e., for $Y_1Ba_2Cu_3O_6+\delta$ at a temperature of approximately 940° C. The composition is then heated in a preheated chamber maintained at approximately about 80° C. to about 190° C. above the melting point of the 1, 2, 3 superconductor, generally about 1,090° C. to about 1,200° C. (approximately 1,100° C. for $Y_1Ba_2Cu_3O_6+\delta$) until it has been decomposed and partially melted and is then rapidly cooled to a temperature about 10° C. to about 30° C. above its melting point, i.e. for $Y_1Ba_2Cu_3O_6+\delta$ a temperature of about 1030° C. and then is cooled at a controlled rate of 1° C./hr until it reaches a temperature of approximately 20° C. to 40° C. below its melting point, i.e., for $Y_1Ba_2Cu_3O_6+\delta$ a temperature of about 980° C. During this process, the grains comprising the material are formed and grown in length approximately 10,000 to 15,000 µm. The material is steadily held at 980° C. for at least eight hours in order to complete the resolidification process. The material is then cooled to a temperature of approximately 400° C. below its melting point (for $Y_1Ba_2Cu_3O_6+\delta$ approximately a temperature of about 600° C.). The material is then slowly cooled by about another 200° C. and is then annealed in oxygen.

DETAILED DESCRIPTION OF THE PREFERRED EMBODIMENTS

Figure 1:
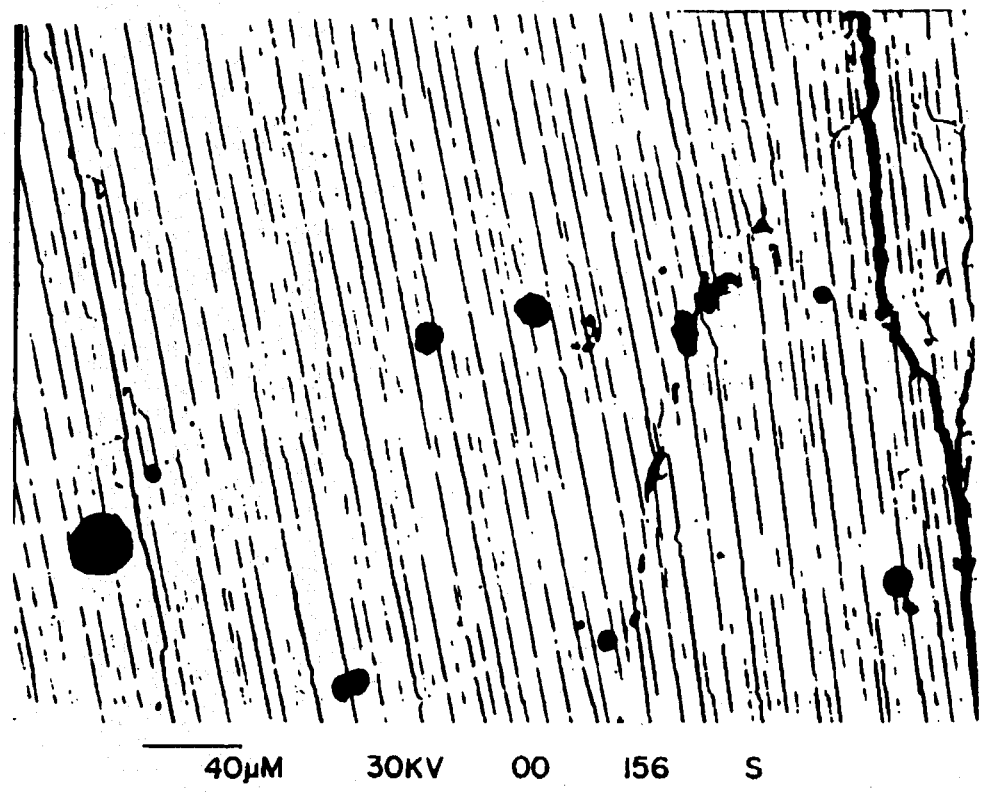
FIG. 1 is 300 times magnification of a scanning electron microscope picture of the top surface of a $Y_1Ba_2Cu_3O_6+\delta$ composition of this invention as prepared according to Example 1.

Superconducting compositions of this invention comprise an oxide complex defined by the formula:

$$L_1Ba_2Cu_3O_6+\delta$$

wherein L is a rare earth element, i.e. scandium, yttrium, lanthanum, cerium, praseodymium, neodymium, samarium, europium, gadolinium, terbium, dysprosium, holmium, erbium, thulium, ytterbium, and lutetium, and $\delta$ has a number value of from about 0.1 to about 1.0. Preferably L is yttrium. Most preferably, $\delta$ is between about 0.5 to about 1.0. Such compositions are characterized by attainment of a zero resistance state at a transition temperature, $T_{c1}$, of 77° K or higher. When prepared in accordance with the process of this invention, such oxide complexes exhibit a J, (defined as the amount of current carried by a 1 cm² cross-section of material) in zero magnetic field at 77° K, of from about 30,000 to about 85,000 amps/cm². Generally, the J of the oxide complexes of this invention are greater than 70,000 amps/cm². At 77° K and an applied magnetic field of 0.6 T, the composition of this invention exhibits a J in excess of 37,000 amps/cm². Further, at 77° K and zero magnetic field, the composition of this invention exhibits a D.C. current density in excess of 18,500 amps/cm².

The oxide complexes of this invention are comprised of plate shaped grains having a length between approximately 10 mm to about 15 mm; an average width between about 5 mm to about 10 mm; and an average thickness between about 16 µm to about 20 µm. Such plate shaped grains may be stacked parallel to each other in the a-b crystallographic basal plane of the superconductor. The thickness of the stacked plate shaped grains is generally between 2 and 3 mm. The shape, length and orientation of the grains are primarily responsible for the dense structure of the oxide and its enhanced conductivity.

In addition to exhibiting high current densities, the oxide complexes of this invention are further capable of entrapping magnetic fields of a much higher magnitude than those entrapped by the high temperature superconductors of the prior art. As a result, the superconductors of this invention have particular applicability as magnets. Magnetic fields, $B_t$, in excess of 1000, even in excess of 1200, and as high as 1280 Gauss have been trapped in the oriented grain oxide complexes of this invention subsequent to the application of an external applied magnetic field of approximately 8,000 Gauss to the oxide complexes. The oxide complexes of this invention are capable of maintaining superconductive properties when exposed to an external magnetic field in excess of 30T (300,000 Gauss) at 77° K. Such oxides are especially valuable therefore in the production of magnets.

When the oxides of this invention are fabricated into cylinders of a 2 cm internal diameter and an external magnetic field is applied, such as approximately 8,000 Gauss, an entrapped field of approximately 6,000 Gauss can be obtained.

A magnetic field can be entrapped in the superconductive material of this invention by various methods. In one method, referred to as field cooling, the superconductive material is placed into an existing magnetic field at a temperature in excess of its transition temperature, $T_c$. Room temperature is sufficient. The sample is then cooled to its transition temperature. In the second method, referred to as zero field cooling, the sample is first cooled to its transition temperature. A field of the magnitude equal to or slightly exceeding that of the lower critical field for the oxide, $H_c$, is then applied. The portion of the magnetic field, $B_t$, remaining trapped inside the sample is maintained within the superconductive material by persistent microscopic vortex currents. The entrapped magnetic field in the sample is measured by a Hall probe placed either adjacent to the sample or non-contiguously to the center of the sample.

The methods can be used with the oriented grain bulk material as well as the fabricated cylinders discussed herein.

The oriented grain oxides of this invention are further characterized by a lower microwave surface impedance than the superconductors of the prior art. The surface impedance can be determined by clamping a polished sample to the bottom of a 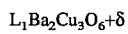 mode cylindrical resonant cavity and measuring the temperature dependence of the width of the cavity mode. The measurements are repeated with a copper end plate and the surface impedance is reported relative to that of copper. Such measurements are indicative of the high-frequency surface resistance and thus indicate the usefulness of the superconductors of this invention in the high frequency communication industry.

Measurements of surface resistance in the a-b basal plane of the aligned oriented oxide grains of this invention at 98 GHz is approximately 5–6 milliohms at or below 60° K. This value is to be compared to about 2000 milliohms at the same frequency and temperature for a sintered 123 material of the prior art. This value was obtained by extrapolation from measurements performed at 77° and 10 GHz. See, W. Kennedy et al, "Frequency Dependence of the Microwave Surface Resistance of Ceramic $Y_1Ba_2Cu_3Oy$", *Solid State Communications*, Vol. 70, No. 7, pp. 741–744, 1989.

The present invention also provides a process for producing the superconductive oxide complexes. Methods of preparing bulk samples containing L, Ba, Cu and O in amounts sufficient to render superconductivity are well known in the art. Such processes include, but are not limited to, solid-state, co-precipitation, and sol-gel techniques. In the solid state process, for example, selected amounts of solid powdered compounds containing barium, copper, oxygen and preferably yttrium, are thoroughly mixed and heated in order to complete a solid state reaction. When the desired complex is of the $Y_1Ba_2Cu_3O_6+\delta$ for example, the complex may be derived from 15 wt. % $Y_2O_3$, 53 wt. % $BaCO_3$, and 32 wt. % $CuO$. The solid powder compounds are preferably mixed in an intensive mixer, such as a jar mill or, more preferably, a ball mill. The mixture is then heated in air at a temperature of between about 920° C. to about 960° C. for a time sufficient to react the mixture in the solid state. When "L" in the above 123 formula is yttrium, the composition is preferably heated to approximately 920° to 940° C. Normally, the mixture is kept at this target temperature for approximately 24 hours. The sample is then cooled, preferably by rapidly quenching to approximately room temperature in air or an inert gas atmosphere.

In the process of this invention the bulk mass comprising L, Ba, Cu and O (in amounts sufficient to render a compound of the formula $L_1Ba_2Cu_3O_6+\delta$) is first compressed by applying pressure to the sample. Normally pressures, generally between about 9,000 to about 11,000 psi, are required until the particles are held together to form a bulk material. When L is yttrium, the pressure is approximately 10,000 psi. The compaction process preferably renders bars having dimensions approximating 6 to 24 mm×4 to 16 mm×30 to 65 mm. Such bars ensure a more uniform distribution of heat within the complex and further assists in the attainment of the desired length of the grains.

The compacted powder is then sintered, preferably in air, at a pressure between about 0 to about 2 kilobars and at a temperature of approximately 50° C. to about 90° C. below its melting point. When L is yttrium, for example, the mass is heated to from about 920° C. to about 960° C. for approximately 24 hours.

The preferred bars are partially sliced, preferably prior to heating, to a thickness of approximately 1.25 mm. to about 2.5 mm. Such slicing is preferably achieved with a diamond saw.

The sintered product is then decomposed by heating it for the appropriate time, generally about 6 to about 12 minutes, in a chamber preheated to a temperature approximately 80° C. to about 190° C. above the melting point of the solid product, generally from about 1090° C. to 1200° C. By rapid heating of the sample (about 20s) beyond the peritectic temperature, formation of low temperature eutectics is avoided. When the oxide is $Y_1Ba_2Cu_3O_6+\delta$ the mass is heated at a temperature of approximately 1100° C. for approximately 8 to 12 minutes, most preferably ten minutes, where the 123 phase melts incongruently into $Y_2BaCuO_5$ and a liquid phase.

The sample is then cooled in two distinct phases. In the first phase, the entire composition is rapidly cooled to a temperature approximately 20° C. to 40° C. above the melting point of material, generally between about 1010° C. to about 1040° C. When L is yttrium, the molten composition is rapidly cooled to 1030° C. in less than about five minutes. In the second phase, the composition is slowly cooled, such that it undergoes peritetic transformation, at a rate of approximately 1° C. per hour until the steady state temperature, approximately 20° C. to about 40° C., below the melting point of the oxide is attained. The steady state temperature is generally between about 960° C. to about 1000° C. While cooling slowly through the peritectic temperature, the decomposed phases react to form the 1-2-3 phase. In this process, no thermal gradient exists in the sample and the whole sample uniformly solidifies at a slow rate through the peritectic point. When L is yttrium, the composition is cooled generally by 1° C. per hour over 50 hours from about 1030° C. to about 980° C. Such a cooling rate is primarily responsible for the formation and positioning of the superconductor grains nearly parallel to one another. During this cooling the grains grow to a length of approximately 10,000 to approximately 15,000 micrometers. The specimen is maintained at the steady state temperature for a time sufficient to complete the solidification process. For a $Y_1Ba_2Cu_3O_6+\delta$ oxide complex, the sample is held at 980° C. for approximately eight hours for the completion of solidification.

The sample is then further cooled at a rate such that the formation of microcracks is minimized. This is generally achieved by cooling the grains in air to approximately 400° C. below its melting point at the rate of approximately 50° C. per hour. In a $Y_1Ba_2Cu_3O_6+\delta$ composition, for example, the specimen is cooled from 980° C. to approximately between 550° C. to about 650° C. in approximately 5.5 to about 6.5 hours. Such gradient cooling renders little disruption, if any, to the near-parallel orientation of the grains.

The transformation of the crystal lattice of the complex from a non-superconductive state to a superconductive state, wherein the orthorhombicity of the crystal lattice is maximized, is achieved by subsequently cooling the complex in air to a temperature approximately 600° C. below its melting point. The rate of cooling is approximately 30° C. per hour. In a $Y_1Ba_2Cu_3O_6+\delta$ composition, the complex is transformed to its superconductive state by cooling it to approximately 380° C. to about 420° C. from approximately 550° C. to about 650° C. in approximately six and a half hours.

The requisite amount of oxygen to obtain a formula of $L_1Ba_2Cu_3O_6+\delta$ is then diffused into the orthorhombic grains by annealing it in an oxygen-containing atmosphere for sufficient time. The resulting crystal having a perovskite structure.

Preferably, the annealing step of the process of this invention is comprised of three distinct stages. All of the stages proceed in the presence of oxygen. In the first stage, the sample is heated for approximately 11 to 13 hours at a temperature of approximately 580° C. to approximately 620° C. In the second stage, the sample is annealed at a temperature approximately 100° less than the first stage, i.e., approximately 480° C. to approximately 520° C. for the same period of time. In the last stage, the sample is annealed at a temperature of approximately 380° C. to approximately 420° C. for approximately 11 to 13 hours. Such a three stage annealing step increases the diffusion of oxygen into the complex, thereby enhancing the formation of the orthorhombic state.

The process of this invention permits the manufacture of superconductive materials of significantly greater dimensions and volumetric size than products produced by the processes of the prior art. Further, superconductive oxides of a given volumetric size are produced in a fraction of the time under this process than under the processes of the prior art. For example, under the preferred embodiments of this invention, a superconductive material with a volume in excess of 6500 mm$^3$ can be prepared in approximately 130 hours.

Figure 2:
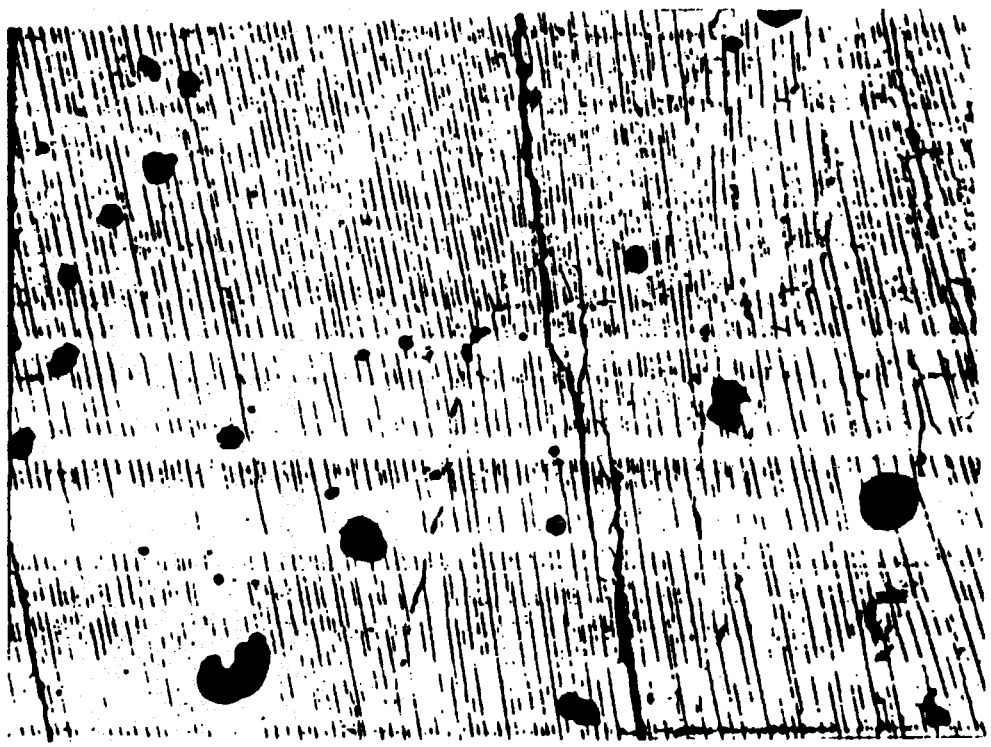
FIG. 2 is a 150 times magnification of a scanning electron microscope picture of a $Y_1Ba_2Cu_3O_6+\delta$ composition prepared in accordance with Example 1.
Figure 3:
FIG. 3 is an optical photomicrograph of 40 times magnification of a $Y_1Ba_2Cu_3O_6+\delta$ composition of this invention as prepared according to Example 1.

Shown in FIGS. 1 and 2 are scanning electron microscopes at 300 and 150 magnifications, respectively, of the $Y_1Ba_2Cu_3O_{6+\delta}$ oxide composition wherein $\delta$ is between 0.7 and 1.0, prepared in accordance with this invention. The oxides prepared in accordance with this invention are comprised of long plate shaped grains typically between 10,000 and approximately 15,000 micrometers in length and approximately 20 micrometers in width. The plate axis coincides with the a-b direction in the superconducting layer of the orthorhombic phase. FIG. 3 illustrates the same composition viewed from an optical photomicrograph at 40 magnification. The parallel plates are characterized by a length of approximately 10,000 to 15,000 micrometers. The length of the grains greatly enhances the conductivity of current. The elongated grains of the oxide of this invention and the crystallographic alignment of the grains along its superconducting direction are highly beneficial for the flow of supercurrent thereby permitting higher J values for the superconductors than those of the prior art.

EXAMPLE 1

In a jar mill were mixed 15 weight percent of $Y_2O_3$, 53 weight percent $BaCO_3$ and 32 weight percent CuO. The mixture was placed in an enclosed platinum container which was then heated at a rate of about 7° C. per minute in air until a temperature of 940° C. was obtained. The mixture was allowed to react at this temperature for about 24 hours. Bar samples of dimensions of 12.7 mm×7.6 mm×63.5 mm were obtained by cold pressing (at room temperature) the oxide mixture at an applied pressure of 10,000 psi. The bars were then partially sliced into sections of thickness 2.5 mm. The samples were then heated in a preheated oven maintained at 1100° C. for ten minutes.

This sample is then cooled rapidly to 1030° C. and then cooled at a rate of 1° C. per hour to 980° C. The sample was held at 980° C. for eight hours and then cooled to 600° C. at the rate of approximately 60° C. per hour. This sample was then additionally cooled slowly to 400° C. at a rate of approximately 30° C. per hour. The sample was then annealed in oxygen for 12 hours each at 600°, 500° and 400° C.

The current density, J at 77° K was tested. Current measurements are performed using a dc power supply of 120 A rating (H.P. model 6011 A) and a Keithley 181 nanovoltmeter. Pulse current up to 120 A was generated by a series of power transistors controlled by a pulse source. At a pulse of 1 msec, J was 75,000 amps/cm$^2$ at zero magnetic field and J was greater than 37,000 amps/cm$^2$ at a 0.6 T magnetic field. A J, for D.C. current, was measured in excess of 18,500 amp/cm$^2$ at 77° K and zero magnetic field.

EXAMPLE 2

Samples prepared substantially as set forth in Example 1 were cut into dimensions 0.4 mm by 0.2–0.4 mm by 10 mm along the a-b plane. Measurements were performed at 77K using both continuous (H.P. model 6011A) and pulse dc currents, as set forth in Example 1. Pulse current density measurements were performed in order to minimize the effect of contact heating and give the true current carrying capacity of these samples. Pulse widths ranging from 1 to 10 ms were used in these measurements. Silver contacts and silver leads were used in these measurements and the samples were annealed in oxygen at 500° C. with the contacts. The resistivity of these contacts at 77K is about 1 $\mu\Omega cm^2$. These samples were able to sustain up to 30 amps for varying times up to 150 s. At these currents, the voltage drop across the sample was constant within 1 $\mu V/cm$.

The current and the voltage drop across the sample were measures using a digital oscilloscope (Nicolet, model 2090). Currents up to 110 amps were used in these measurements. The noise level in the voltage drop signal across the sample was approximately 50 $\mu V$ which remained unchanged regardless of the current that passed through the specimen. The results of the measurements repeatedly exhibited by these samples are shown in Table I.

TABLE I

| Pulse width (ms) | Magnetic field (G) | Current density (A/cm$^2$) |
| --- | --- | --- |
| 1 | 0 | 75,000 |
| 10 | 0 | 62,000 |
| 1 | 6000 | 37,000 |
| ∞(dc) | 0 | 18,500 |

As seen from Table I, in the absence of a magnetic field, the samples exhibits a current density in excess of 62,000 A/cm$^2$ when tested with a 10 ms pulse and in excess of 75,000 A/cm$^2$ when a 1 ms pulse was used. Samples tested in a magnetic field of 6000 G exhibited current density in excess of 37,000 A/cm$^2$ with a 1 ms pulse. In all these tests, the samples remained in the superconducting state until the end of the measurements and were not transformed to the normal state.

EXAMPLE 3

A sample prepared substantially as set forth in Example 1 was cut into dimensions of 5 mm×5 mm×2 mm. The sample was cooled to approximately 77° K and placed on a glass disc. The sample was then exposed to a magnetic field of approximately 8,000 Gauss for approximately one minute. An entrapped field, determined by placing a Hall probe adjacent to the center of the sample, of 1,280 Gauss was recorded.

EXAMPLE 4

Figure 4:
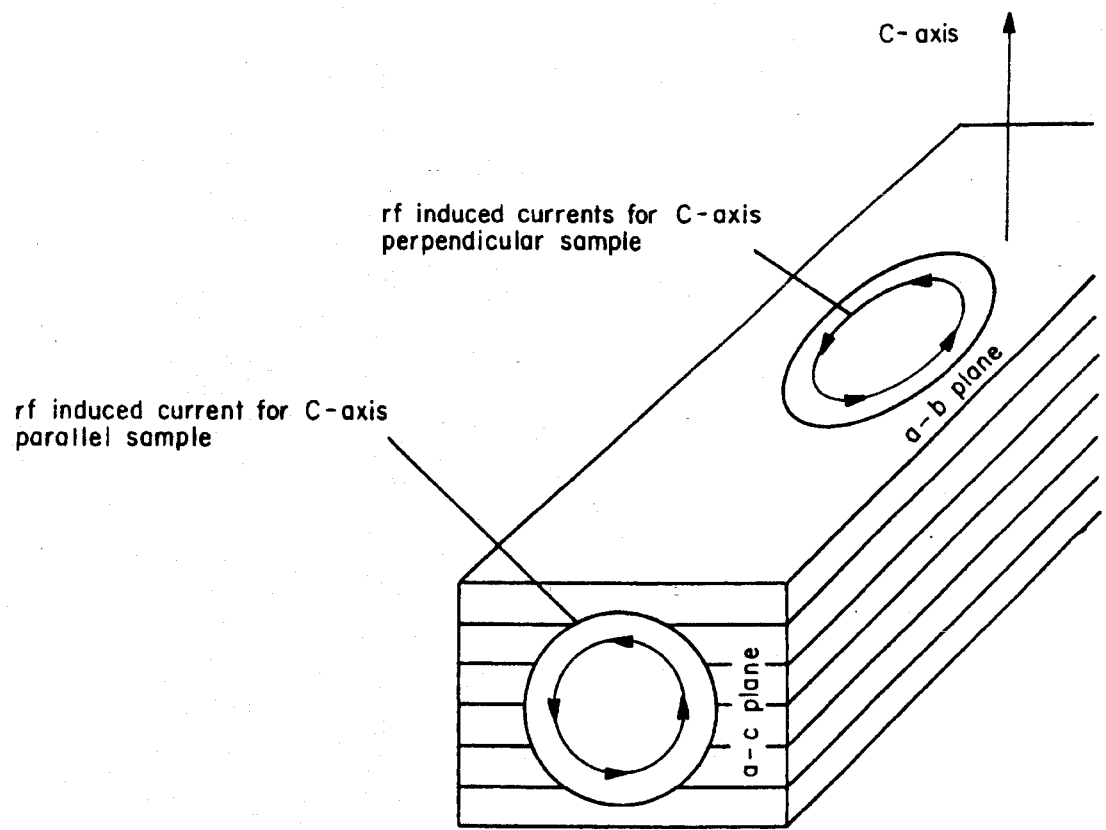
FIG. 4 represents the configuration of the rf induced current flowing in the oriented grain sample, as set forth in Example 4.

Measurements were performed on thin plates of the samples prepared substantially as set forth in Example 1. The thin plates were cut and polished with 0.3 micron sand paper. One sample (1 mm thick with 4×5 mm$^2$ area) was cut with the c-axis normal to its surface. This sample is referred to as the c-axis perpendicular sample. In this sample, the rf induced current flow is in the a-b plane. FIG. 4 represents schematically the orientation of the grain-oriented sample to the rf current. The second sample (1 mm thick with 10×5 mm$^2$) had the c-axis parallel to the a-c plane. This sample is hereinafter called the c-axis parallel sample. For this sample, the induced rf current flow is in the plane perpendicular to the a-b plane.

Surface impedance measurements were performed in accordance with D. Kajfez, E. J. Hwan, IEEE Transaction on Microwave Theory and Techniques, Vol. Mtt-32, 666

(1984), in a $TE_{o11}$ mode cylindrical resonant copper cavity having an endplate of the superconductive material of Example 1. Aperture coupling was used through the side of the cavity body. Cavity cooling was by a helium closed cycle cryostat operating between 15° and 300° K.

The unloaded quality factor of the cavity was measured by Ginzton's impedance method as adapted for an HP8510 network analyzer with a 75–100 GHz test set. (See E. L. Ginzton "Microwave Measurements" McGraw-Hill, New York (1957).

Figure 5:
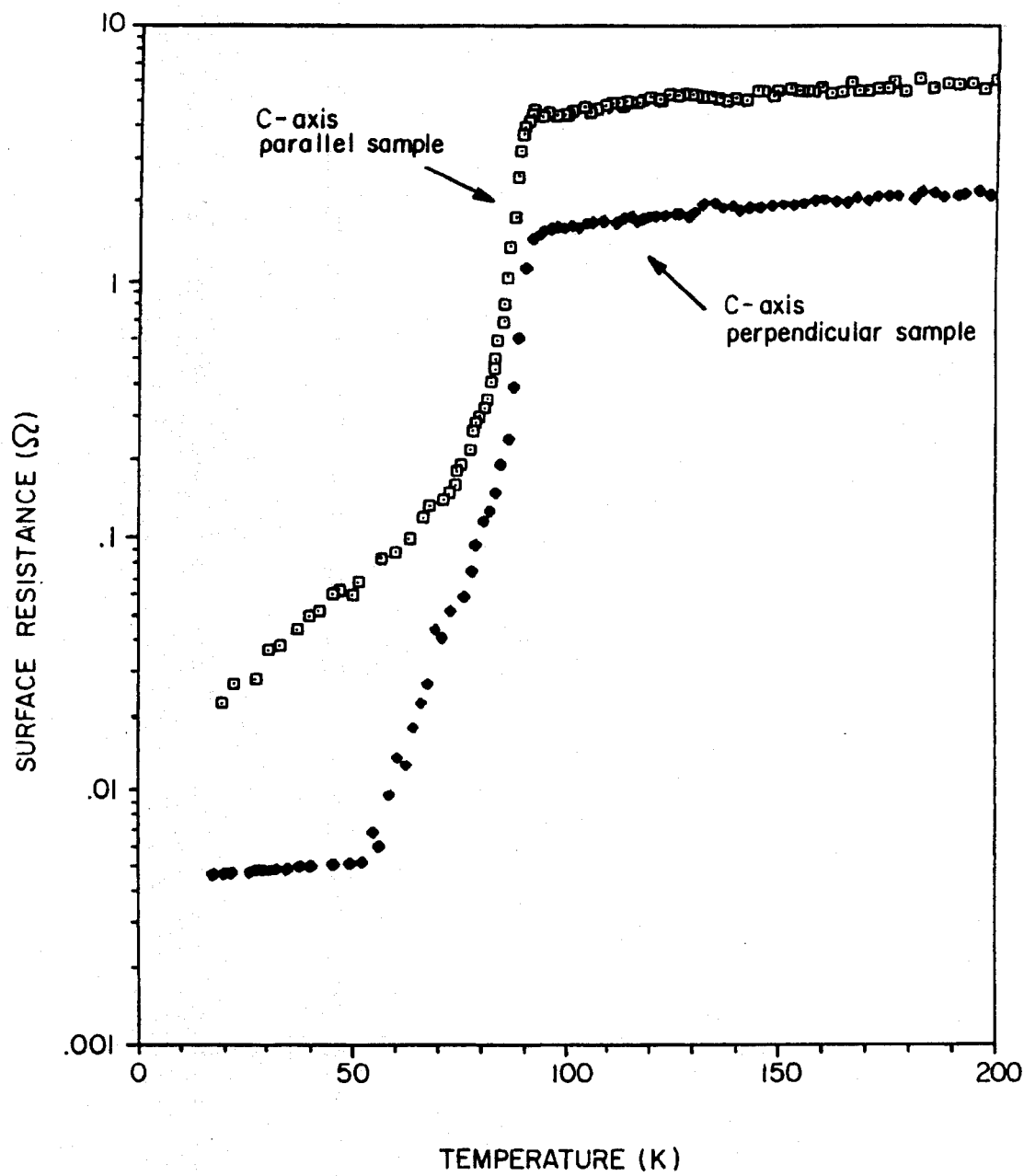
FIG. 5 demonstrates the surface impedance (y-axis) of the grain-oriented superconductors of this invention at temperatures (x-axis) at 98 GHz at the a-c and a-b planes.

FIG. 5 demonstrates the surface resistance versus temperatures for both sample orientations at 98 GHz. At 77 K the surface resistance at 98 GHz for the c-axis parallel sample is as high as 120 mΩ, while for the a-b plane the surface resistance is only 60 mΩ. At or below approximately 60° K, the surface area resistance in the a-b plane is approximately 5 milliohms.

As is readily apparent from the above description additional advantages and modifications will readily occur to one skilled in the art. The invention in its broader aspects is therefore not limited to the specific examples shown and described. Accordingly, departures may be made from the details shown in the example without departing from the spirit or scope of the disclosed general inventive concept.

We claim:

1. A process for preparing a superconducting metal oxide complex comprising the steps of:
    (a) mixing solid compounds containing L, Ba, Cu, and O in amounts appropriate to yield the formula $L_1Ba_2Cu_3O_{6+\delta}$ wherein L is a rare earth element and $\delta$ has a number value of from about 0.5 to about 1.0;
    (b) heating the solid compounds at a temperature and for a time sufficient to react the compounds in the solid state;
    (c) cooling the solid state reaction product to ambient temperature;
    (d) compacting the cooled solid state reaction product into a solid mass by application of pressure;
    (e) sintering the compacted mass at a temperature between about 40° C. to about 90° C. below its melting point;
    (f) heating the sintered mass in a preheated chamber to a temperature of from about 80° C. to 190° C. above its melting point for a time sufficient to partially melt and decompose said sintered mass;
    (g) rapidly cooling the heated mass to a temperature between about 10° C. to 40° C. above its melting point and then slowly cooling the rapidly cooled mass to a steady temperature between about 20° C. to 40° C. below its melting point at a rate of approximately 1° C./hour;
    (h) maintaining the slowly cooled mass at said steady temperature for a time sufficient for the entire slowly cooled mass to resolidify; and
    (i) annealing the resolidified mass in an oxygen containing atmosphere for a time sufficient for the requisite amount of oxygen to diffuse into the resolidified mass.

2. The process of claim 1, wherein L is yttrium.

3. A method for conducting an electrical current within a conductor material without electrical resistive losses, comprising the steps of utilizing as the conductor material a metal oxide complex comprising grains oriented by cooling a molten sample through its peritectic temperature, said grains being of the formula $L_1Ba_2Cu_3O_6+\delta$ wherein L is a rare earth element and $\delta$ has a number value from about 0.5 to about 1.0 and further wherein, at 77° K, the current density of said composition is greater than 70,000 amps/cm$^2$ at zero magnetic field and the current density is greater than 37,000 amps/cm$^2$ under a 0.6 T magnetic field;
    cooling said metal oxide complex to a temperature at or below that at which said metal oxide complex becomes superconductive; and
    initiating a flow of electrical current within said metal oxide complex while maintaining said metal oxide complex at or below the temperature at which it becomes superconductive.

4. The process of claim 1, wherein said resolidified mass is annealed in oxygen in three distinct and separate temperature zones.

5. The process of claim 4, wherein the resolidified mass of step (d) is first cooled from said steady temperature to approximately 400° C. below its melting point at the rate of approximately 60° C. per hour; and is then additionally cooled to approximately 600° C. below its melting point at the rate of approximately 30° C. per hour.

6. The process of claim 4, wherein the resolidified mass is annealed in oxygen in a first temperature zone between about 580° C. to about 620° C.; a second temperature zone between about 480° C. to about 520° C.; and a third temperature zone between about 380° C. to about 420° C.

7. The process of claim 2, wherein the compacted solid mass is sintered in step (a) at a temperature between about 920° C. to 960° C.

8. The process of claim 7 wherein the solid mass is heated in a preheated chamber in step (b) to a temperature of from about 1,090° C. to about 1,200° C.

9. The process of claim 8 wherein the mass is rapidly cooled in step (c) to a temperature between about 1,010° C. to about 1,040° C.

10. The process of claim 9 wherein the composition is slowly cooled from about 1,030° C. to about 980° C. at a rate of approximately 1° C./hour.

11. The process of claim 2 wherein the steady temperature of step (d) is approximately 980° C.

12. The process of claim 2 wherein the resolidified mass of step (d) is first cooled from said steady temperature to approximately 550° C. to about 650° C. at the rate of approximately 60° C. per hour and then is additionally cooled to about 380° C. to about 420° C. at the rate of approximately 30° C. per hour.

13. The process of claim 1, wherein said compacted solid mass of step (a) is obtained by
    (1) mixing the solid compounds containing L, Ba, Cu and O in amounts appropriate to yield the formula $L_1Ba_2Cu_3O_6+\delta$ wherein $\delta$ has a number value of from about 0.5 to about 1.0;
    (2) heating the solid compounds to a temperature between about 920° C. to about 960° C. for a time sufficient to react the compounds in the solid state;
    (3) cooling the solid state reaction product to ambient temperature; and
    (4) compacting the mixture into a solid mass by application of pressure.

14. The process of claim 1, wherein the resolidified mass of step (d) is first cooled from said steady temperature to approximately 400° C. below its melting point at the rate of approximately 60° C. per hour; and is then additionally cooled to approximately 600° C. below its melting point at the rate of approximately 30° C. per hour.

15. The process of claim 1, wherein said compacted solid mass are bars having the dimensions 6–24 mm×4–16 mm×33–130 mm.

16. The process of claim 15, wherein prior to heating in step (b) said bars are partially sliced to a thickness between about 1.25 mm to about 2.5 mm.

17. The process of claim 1, wherein the heating of the solid mass in step (e) is conducted at a pressure between about zero to about 2 kilobars.

18. The process of claim 1, wherein said resolidified mass is annealed in oxygen in three distinct and separate temperature zones for 11 to 13 hours per zone.

19. The process of claim 18, wherein the first temperature zone is between about 580° C. to about 620° C., the second temperature zone is between about 480° C. to about 520° C. and the third temperature zone is between about 380° C. to about 420° C.

20. A process for preparing a superconducting metal oxide complex comprising the steps of:

(a) mixing solid compounds containing L, Ba, Cu, and O in amounts appropriate to yield the formula $L_1Ba_2Cu_3O_{6+\delta}$ wherein L is a rare earth element and $\delta$ has a number value of from about 0.5 to about 1.0;

(b) heating the solid compounds at a temperature and for a time sufficient to react the compounds in the solid state;

(c) cooling the solid state reaction product to ambient temperature;

(d) compacting the cooled solid state reaction product into a solid mass by application of pressure;

(e) sintering the compacted mass at a temperature between about 920° C. to about 960° C.;

(f) heating the sintered mass in a preheated chamber to a temperature of from about 1,090° C. to 1,200° C. for a time sufficient to partially melt and decompose said sintered mass;

(g) rapidly cooling the heated mass to a temperature between about 1,020° C. to 1,040° C. and then slowly cooling the rapidly cooled mass to a steady temperature between about 20° C. to 40° C. below its melting point at a rate of approximately 1° C./hour;

(h) maintaining the slowly cooled mass at said steady temperature for a time sufficient for the entire slowly cooled mass to resolidify; and (i) annealing the resolidified mass in an oxygen containing atmosphere for a time sufficient for the requisite amount of oxygen to diffuse into the resolidified mass.

* * * * *